(12) United States Patent
Ishihara

(10) Patent No.: US 9,595,973 B2
(45) Date of Patent: Mar. 14, 2017

(54) ATOM CELL, QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventor: Naoki Ishihara, Chino (JP)

(73) Assignee: Seiko Epson Corporation (JP)

( * ) Notice: Subject to any disclaimer, the term of this patent is extended or adjusted under 35 U.S.C. 154(b) by 71 days.

(21) Appl. No.: 14/477,187

(22) Filed: Sep. 4, 2014

(65) Prior Publication Data
US 2015/0061785 A1    Mar. 5, 2015

(30) Foreign Application Priority Data
Sep. 5, 2013  (JP) ................. 2013-183735

(51) Int. Cl.
*G04F 5/14*    (2006.01)
*H01S 1/06*    (2006.01)
*H03L 7/26*    (2006.01)

(52) U.S. Cl.
CPC ............... *H03L 7/26* (2013.01); *G04F 5/145* (2013.01); *H01S 1/06* (2013.01)

(58) Field of Classification Search
CPC ... G04F 5/14; G04F 5/145; H03L 7/26; H01S 1/06
USPC ...................................... 331/94.1, 3
See application file for complete search history.

(56) References Cited

U.S. PATENT DOCUMENTS

| 2011/0187464 | A1  | 8/2011 | Youngner et al. | |
| 2011/0232782 | A1* | 9/2011 | Borwick et al. | 137/551 |
| 2015/0028866 | A1* | 1/2015 | Parsa et al. | 324/252 |

FOREIGN PATENT DOCUMENTS

| JP | 2009-302706 A | 12/2009 |
| JP | 2010-205875 A | 9/2010 |
| JP | 2012-013671 A | 1/2012 |

* cited by examiner

*Primary Examiner* — Ryan Johnson
(74) *Attorney, Agent, or Firm* — Harness, Dickey & Pierce, P.L.C.

(57) ABSTRACT

An atomic oscillator includes a pair of window units, a wall extending between the pair of window units and forming a first space in which alkali metal in a gas state is housed with the pair of window units, and a second space communicating with the first space and provided in a position with the wall between the first and second spaces and housing alkali metal in a liquid or solid state.

23 Claims, 11 Drawing Sheets

ATOM CELL, QUANTUM INTERFERENCE DEVICE, ATOMIC OSCILLATOR, ELECTRONIC APPARATUS, AND MOVING OBJECT

BACKGROUND

1. Technical Field

The present invention relates to an atom cell, a quantum interference device, an atomic oscillator, an electronic apparatus, and a moving object.

2. Related Art

Atomic oscillators that oscillate based on an energy transition of alkali metal atoms including rubidium and cesium are known for having high-accuracy oscillation characteristics on a long-term basis.

Generally, the operation principle of atomic oscillators is roughly classified into a system using a double resonance phenomenon by light and microwave and a system using a quantum interference effect (CPT: Coherent Population Trapping) by two kinds of lights having different wavelengths.

Typically, in either atomic oscillator system an alkali metal is entrapped within a gas cell (atom cell) and the gas cell is heated to a predetermined temperature by a heater so that the alkali metal may be kept in a fixed gas condition.

Here, generally, not all of the alkali metal within the gas cell is gasified, but part of the metal is liquefied as an excess. The excessive alkali metal atoms are liquefied by precipitation (condensation) in a part of the gas cell at a lower temperature. If the liquid exists in a region in which excitation light passes, the liquid blocks the excitation light and, as a result, causes degradation of the oscillation characteristics of the atomic oscillator.

Accordingly, in a gas cell according to JP-A-2010-205875, a recessed part for precipitation of the alkali metal is provided on the inner wall surface of the gas cell.

However, in the gas cell according to JP-A-2010-205875, the excessive alkali metal precipitated within the recessed part faces the passage region of the excitation light and part of the excited gaseous alkali metal comes into contact with the excessive alkali metal within the recessed part, and thereby, the condition of the excited gaseous alkali metal becomes inhomogeneous. As a result, a problem of degradation of the oscillation characteristics (e.g., frequency fluctuations) occurs.

SUMMARY

An advantage of some aspects of the invention is to provide an atom cell, a quantum interference device, and an atomic oscillator that may suppress degradation of oscillation characteristics by excessive metal atoms, and to provide an electronic apparatus or a moving object including the quantum interference device with advantageous reliability.

The invention can be implemented as the following forms or application examples.

Application Example 1

An atom cell according to this application example of the invention includes a gas housing part having a pair of window parts (first and second window units or transparent covers) and a wall part provided between the pair of window parts and housing metal atoms in a gas state, and a metal reservoir part housing metal atoms in a liquid state or solid state and communicating with the gas housing part, wherein the wall part intervenes between the metal reservoir part and the gas housing part.

According to the atom cell, the wall part intervenes between the gas housing part and the metal reservoir part, and thereby, contact between the gaseous metal atoms within the gas housing part and the liquid-state or solid-state metal atoms may be suppressed. That is, the liquid-state or solid-state metal atoms are prevented from facing the gas housing part and the gaseous metal atoms within the gas housing part are harder to come into contact with the liquid-state or solid-state metal atoms. As a result, the condition of the gaseous metal atoms within the gas housing part may be prevented or suppressed from being inhomogeneous and characteristic degradation due to excessive metal atoms may be suppressed.

Application Example 2

In the atom cell according to the application example of the invention, it is preferable that the metal reservoir part has a part extending in a direction along an inner wall surface of the wall part.

With this configuration, the atom cell may be downsized while the desired volume of the metal reservoir part is secured.

Application Example 3

In the atom cell according to the application example of the invention, it is preferable that the metal reservoir part has a part extending along a direction in which the pair of window parts are arranged.

With this configuration, formation of the metal reservoir part is easier.

Application Example 4

In the atom cell according to the application example of the invention, it is preferable that the metal reservoir part has apart having a narrower width (a constricted section).

With this configuration, when wettability of the liquid-state metal atoms with respect to the inner wall surface of the metal reservoir part is relatively low, the liquid-state metal atoms may be made to stay in the narrower part of the metal reservoir part by a capillary phenomenon.

Application Example 5

In the atom cell according to the application example of the invention, it is preferable that the metal reservoir part has a part having a wider width (an expanded section).

With this configuration, when wettability of the liquid-state metal atoms with respect to the inner wall surface of the metal reservoir part is relatively high, the liquid-state metal atoms may be made to stay in the wider part of the metal reservoir part by surface tension.

Application Example 6

In the atom cell according to the application example of the invention, it is preferable that the metal reservoir part has a part having a width from 0.1 mm to 2 mm.

With this configuration, the liquid-state metal atoms may be made to stay in the metal reservoir part.

Application Example 7

In the atom cell according to the application example of the invention, it is preferable that a communication part (an interconnect) that allows the gas housing part and the metal reservoir part to communicate with each other, and connects to one window part of the pair of window parts is provided.

With this configuration, the atom cell may be downsized while the desired volume of the metal reservoir part is secured.

Application Example 8

In the atom cell according to the application example of the invention, it is preferable that the metal reservoir part has a part having a width wider toward the other window part side.

With this configuration, the liquid-state metal atoms may be made to stay in the metal reservoir part while the desired volume of the metal reservoir part is secured.

Application Example 9

In the atom cell according to the application example of the invention, it is preferable that a first communication part (interconnect) that connects the gas housing part and an end of the metal reservoir part at one window part side, and allows the gas housing part and the metal reservoir part to communicate with each other, and a second communication part (interconnect) that connects the gas housing part and an end of the metal reservoir part at the other window part side, and allows the gas housing part and the metal reservoir part to communicate with each other are provided.

With this configuration, the metal reservoir part communicates with the gas housing part via the two communication parts, and thereby, even if the liquid-state metal atoms are precipitated in the gas housing part, the liquid-state metal atoms may be easily moved to the metal reservoir part via the communication parts.

Application Example 10

In the atom cell according to the application example of the invention, it is preferable that the metal reservoir part is provided between the pair of window parts.

With this configuration, the small atom cell having the gas housing part and the metal reservoir part may be precisely and easily formed.

Application Example 11

A quantum interference device according to this application example of the invention includes the atom cell according to the application example of the invention.

According to the quantum interference device, characteristic degradation due to excessive metal atoms may be suppressed.

Application Example 12

An atomic oscillator according to this application example of the invention includes the atom cell according to the application example of the invention.

According to the atomic oscillator, characteristic degradation due to excessive metal atoms may be suppressed.

Application Example 13

An electronic apparatus according to this application example of the invention includes the atom cell according to the application example of the invention.

With this configuration, the electronic apparatus with advantageous reliability may be provided.

Application Example 14

A moving object according to this application example of the invention includes the atom cell according to the application example of the invention.

With this configuration, the moving object with advantageous reliability may be provided.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

A quantum interference device, an atomic oscillator, an electronic apparatus, and a moving object according to the invention will be explained in detail below based on embodiments shown in the accompanying drawings.

1. Atomic Oscillator

First, the atomic oscillator (the atomic oscillator including the quantum interference device) will be explained. Note that an example in which the quantum interference device according to the invention is applied to the atomic oscillator will be explained below, however, the quantum interference device according to the invention may be applied not only to the atomic oscillator but also to a magnetic sensor, a quantum memory, or the like, for example.

First Embodiment

Figure 1:
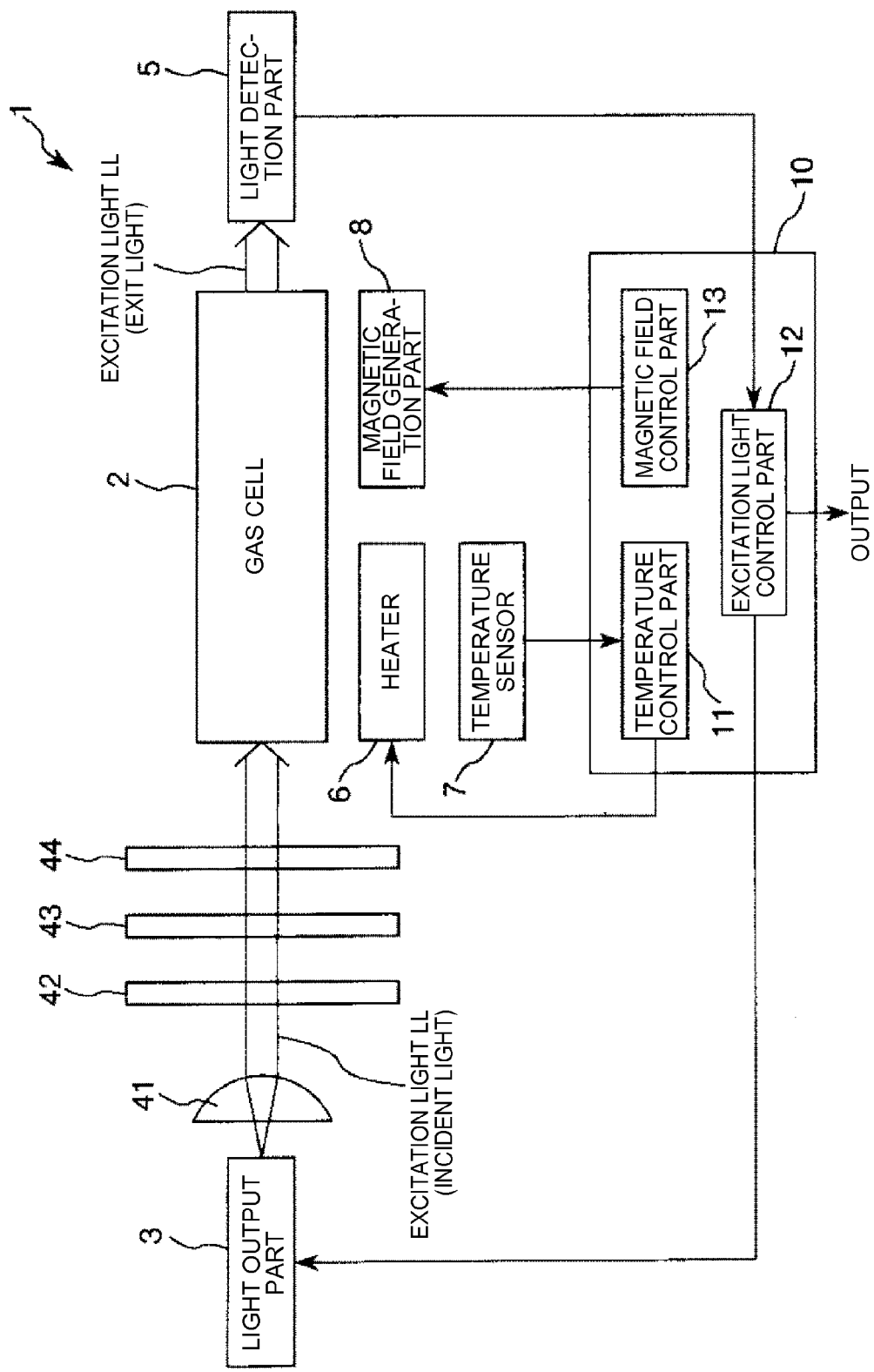
FIG. 1 is a schematic diagram showing an atomic oscillator (quantum interference device) according to a first embodiment of the invention.
Figure 2:
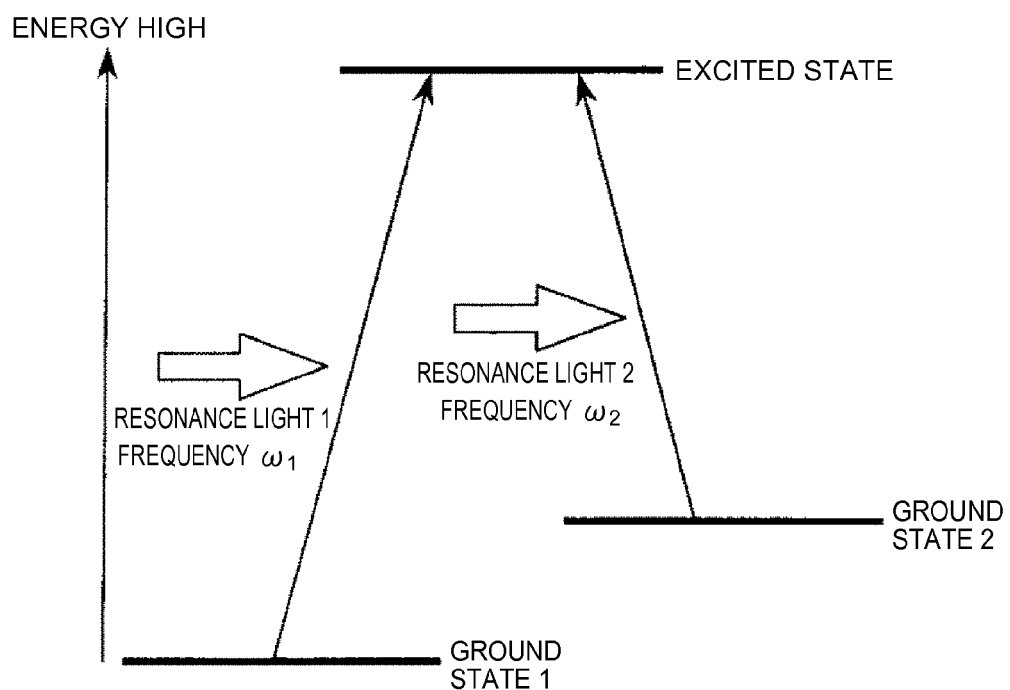
FIG. 2 is a diagram for explanation of energy states of an alkali metal within a gas cell of the atomic oscillator shown in FIG. 1.
Figure 3:
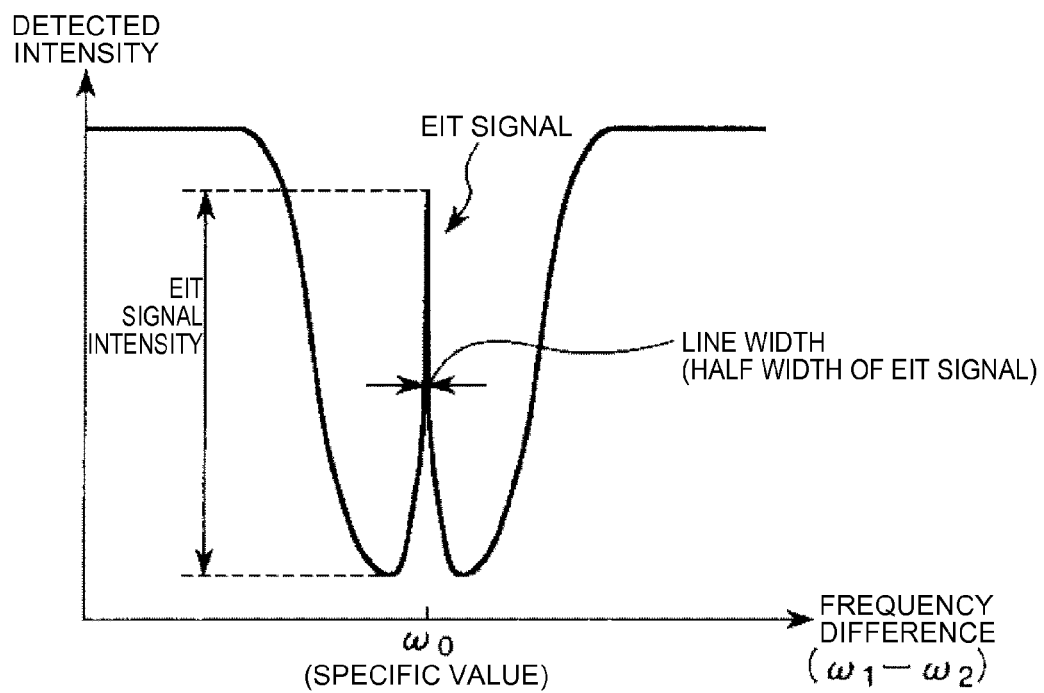
FIG. 3 is a graph showing a relationship, with respect to a light output part and a light detection part of the atomic oscillator shown in FIG. 1, between a frequency difference between two lights from the light output part and detected intensity in the light detection part.

FIG. 1 is a schematic diagram showing an atomic oscillator (quantum interference device) according to the first embodiment of the invention. Further, FIG. 2 is a diagram for explanation of energy states of an alkali metal within a gas cell of the atomic oscillator shown in FIG. 1, and FIG. 3 is a graph showing a relationship, with respect to a light output part and a light detection part of the atomic oscillator shown in FIG. 1, between a frequency difference between two lights from the light output part and detected intensity in the light detection part. Furthermore, FIG. 4 is a perspective view of the gas cell of the atomic oscillator shown in FIG. 1, FIG. 5 is a longitudinal sectional view of the gas cell shown in FIG. 4, and FIG. 6 is a cross-sectional view of the gas cell shown in FIG. 4.

Figure 4:
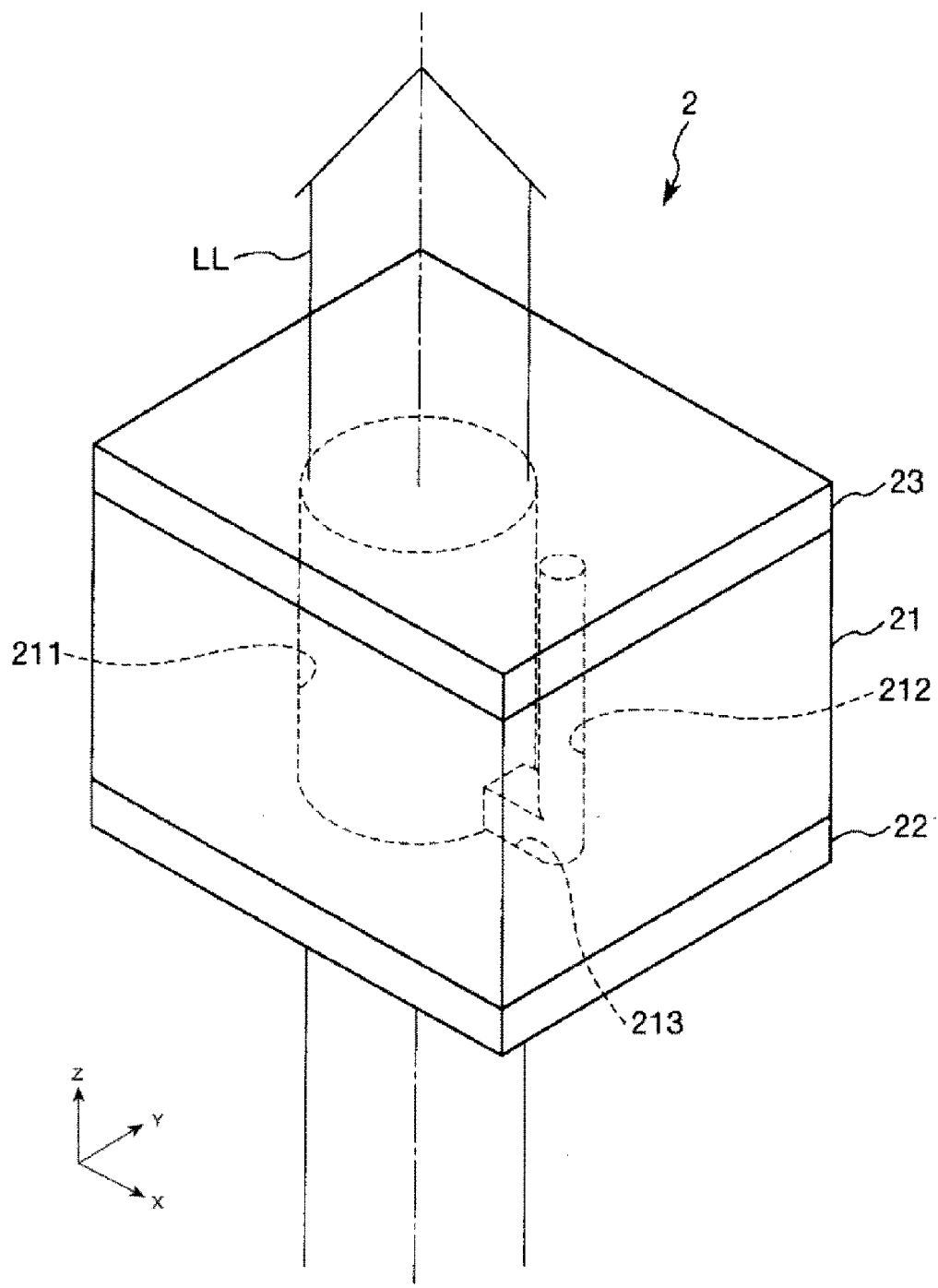
FIG. 4 is a perspective view of the gas cell of the atomic oscillator shown in FIG. 1.
Figure 5:
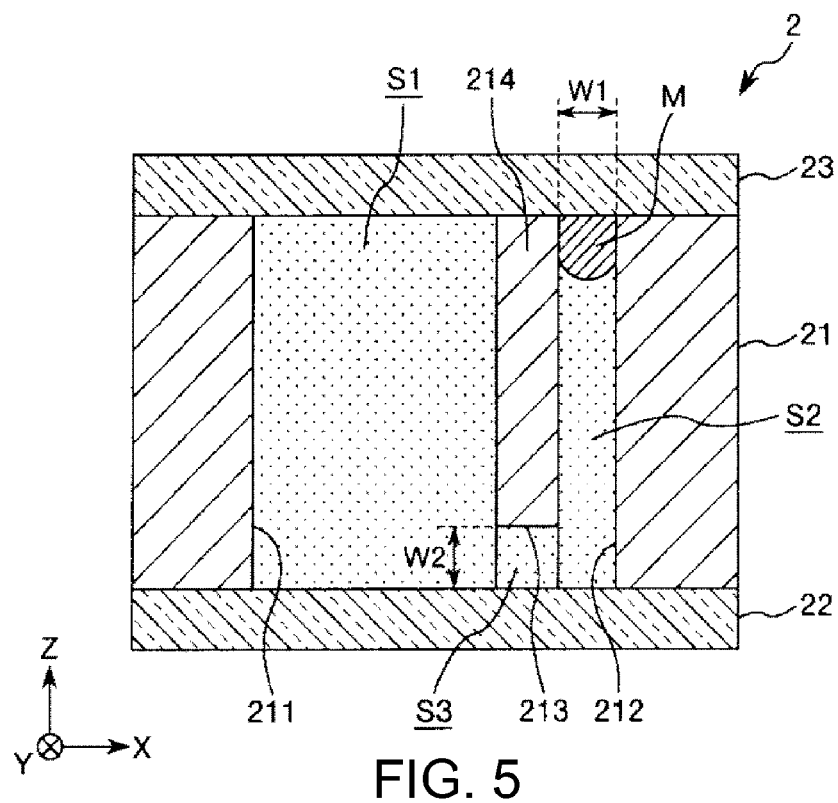
FIG. 5 is a longitudinal sectional view of the gas cell shown in FIG. 4.
Figure 6:
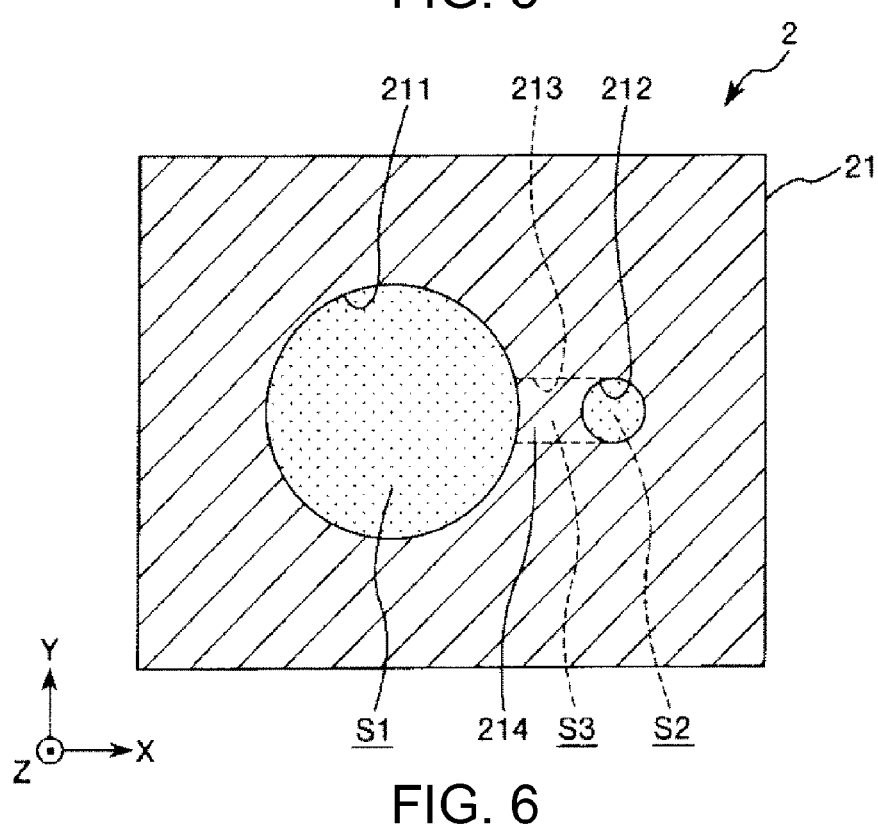
FIG. 6 is a cross-sectional view of the gas cell shown in FIG. 4.

Note that, in FIGS. 4 to 6, for convenience of explanation, an X-axis, a Y-axis, and a Z-axis are shown as three axes orthogonal to one another, and the tip end sides of the respective arrows are referred to as "+" and the base end sides are referred to as "−". Further, for convenience of explanation, a direction in parallel to the X-axis is referred to as "X-axis direction", a direction in parallel to the Y-axis is referred to as "Y-axis direction", and a direction in parallel to the Z-axis is referred to as "Z-axis direction".

An atomic oscillator 1 shown in FIG. 1 is an atomic oscillator using a quantum interference effect.

As shown in FIG. 1, the atomic oscillator 1 includes a gas cell 2 (atom cell), a light output part 3, optical components 41, 42, 43, 44, a light detection part 5, a heater 6, a temperature sensor 7, a magnetic field generation part 8, and a control part 10.

First, the principle of the atomic oscillator 1 will be briefly explained.

In the atomic oscillator 1, an alkali metal (metal atoms) of gaseous rubidium, cesium, or sodium is entrapped within the gas cell 2.

As shown in FIG. 2, the alkali metal has energy levels of a three-level system, and may take three states of two ground states (ground states 1, 2) at different energy levels and an excited state. Here, the ground state 1 is the energy state lower than the ground state 2.

With respect to the gaseous alkali metal, when two kinds of resonance lights 1, 2 having different wavelengths are applied to the above described gaseous alkali metal, light absorptance (light transmittance) of the resonance lights 1, 2 in the alkali metal changes in response to a difference ($\omega 1 - \omega 2$) between the frequency $\omega 1$ of the resonance light 1 and the frequency of the resonance light 2.

Further, when the difference ($\omega 1 - \omega 2$) between the frequency $\omega 1$ of the resonance light 1 and the frequency $\omega 2$ of the resonance light 2 coincides with the frequency corresponding to the energy difference between the ground state 1 and the ground state 2, excitation from the ground states 1, 2 to the excited state is respectively stopped. In this regard, both of the resonance lights 1, 2 are transmitted through the alkali metal, and not absorbed. The phenomenon is called a CPT phenomenon or electromagnetically induced transparency (EIT).

The light output part 3 outputs the above described two kinds of lights (resonance light 1 and resonance light 2) having different frequencies toward the gas cell 2.

Here, for example, in the case where the frequency $\omega 1$ of the resonance light 1 is fixed and the frequency $\omega 2$ of the resonance light 2 is changed, when the difference ($\omega 1 - \omega 2$) between the frequency $\omega 1$ of the resonance light 1 and the frequency $\omega 2$ of the resonance light 2 coincides with the frequency $\omega 0$ corresponding to the energy difference between the ground state 1 and the ground state 2, the detected intensity of the light detection part 5 steeply increases as shown in FIG. 3. The steep signal is called an EIT signal. The EIT signal has an eigenvalue with respect to each kind of alkali metal. Therefore, the EIT signal is used as a reference, and thereby, a high-precision oscillator may be realized.

Below, the respective parts of the atomic oscillator 1 will be sequentially explained in detail.

Gas Cell

A gaseous alkali metal of rubidium, cesium, or sodium is entrapped within the gas cell 2.

As shown in FIGS. 4 and 5, the gas cell 2 has a main body part 21, and a pair of window parts 22, 23 provided with the main body part 21 therebetween.

In the main body part 21, columnar through holes 211, 212 penetrating in the Z-axis direction and a groove 213 opening to the side of the −Z-axis direction and allowing the through holes 211, 212 to communicate with each other are formed.

Further, the window part 22 is bonded to the end surface of the main body part 21 at the side in the −Z-axis direction and, on the other hand, the window part 23 is bonded to the end surface of the main body part 21 at side in the +Z-axis direction. Thereby, a space S1 in the through hole 211 and spaces S2, S3 in the through hole 212 and the groove 213 are formed. That is, the gas cell 2 has the communicating spaces S1, S2, S3 and the spaces S1, S2 communicate with each other via the space S3.

The space S1 is a gas housing part in which the gaseous alkali metal is housed. The space S1 is formed by the pair of window parts 22, 23 and a wall part 214. Here, the wall part 214 is a cylindrical part forming the inner wall surface of the through hole 211 of the main body part 21 provided between the pair of window parts 22, 23, and contained in the main body part 21.

The gaseous alkali metal housed within the space S1 is excited by excitation light LL. Note that, hereinafter, a region in which the excitation light LL passes within the space S1 is referred to as "excitation light passage region". In the embodiment, the cross section of the excitation light passage region has a similar shape with the cross section of the space S1 and is set to be slightly smaller than the cross section of the space S1.

The space S2 is a metal reservoir part containing an alkali metal M in a liquid or solid state. The space S2 communicates with the space S1 via the space S3 and is provided in a position with the wall part 214 between the space S1 and itself.

The space S2 as the metal reservoir part is provided as described above, and thereby, contact between the gaseous alkali metal within the space S1 and the liquid-state or solid-state alkali metal M may be suppressed. That is, as seen from inside of the space S1, the solid-state alkali metal M is behind the wall part 214 and the liquid-state or solid-state alkali metal M is prevented from facing the space S1, and the gaseous alkali metal within the space S1 resists coming into contact with the liquid-state or solid-state alkali metal M. As a result, the condition of the gaseous alkali metal within the space S1 may be prevented or suppressed from being inhomogeneous and characteristic degradation due to the alkali metal M as excessive metal atoms may be suppressed.

Further, as described above, the spaces S1, S2 are formed by blocking of the openings on both ends of the through holes 211, 212 formed in the main body part 21 by the pair of window parts 22, 23, respectively. Thereby, the small gas cell 2 having the space S1 and the space S2 may be precisely and easily formed. Specifically, for example, a substrate such as a silicon substrate or glass substrate is processed using a microfabrication technology including etching, and thereby, the small and precise main body part 21 may be easily and efficiently formed. Accordingly, the small gas cell 2 may be precisely and easily formed. Particularly, compared to an atomic oscillator of the system using double resonance, the atomic oscillator of the system using CPT is more appropriate for downsizing and, recently, has been expected for incorporation into various devices and strongly requested for further downsizing. Thus, the advantage that the small gas cell 2 may be precisely and easily formed is important for the atomic oscillator 1 of the system using CPT.

Furthermore, the space S2 extends in a direction along the inner wall surface of the wall part 214, and thereby, the gas cell 2 may be downsized while the desired volume of the space S2 is secured. Particularly, the space S2 extends along the direction in which the pair of window parts 22, 23 are arranged (i.e., the Z-axis direction). Thus, the space S2 may be formed by processing of the substrate in the thickness direction using the microfabrication technology including etching as described above, and thereby, the formation of the space S2 is easier.

The width of the space S2 is determined according to the volume of the excessive alkali metal M, the volume of the whole gas cell 2, or the like, but not particularly limited. Regarding the width along the X-axis direction, the minimum width W1 of the space S2 is preferably from 0.1 mm to 2 mm and more preferably from 0.1 mm to 1 mm. In other words, the space S2 preferably has a part with a width from 0.1 mm to 2 mm and more preferably has a part with a width from 0.1 mm to 1 mm. Thereby, the liquid-state alkali metal M is easily made to stay in the space S2. For example, when wettability of the liquid-state alkali metal M with respect to the inner wall surface of the space S2 is relatively high, the liquid-state alkali metal M may be made to stay within the space S2 by the capillary phenomenon. Further, in the embodiment, only one end of the space S2 is opened in communication with the space S1 via the space S3 , and the liquid-state alkali metal M is placed in the other end of the space S2. Therefore, even when the wettability of the liquid-state alkali metal M with respect to the inner wall surface of the space S2 is relatively low, the liquid-state alkali metal M may be made to stay in the other end of the space S2 by the same action as that of a liquid-column thermometer.

Here, the liquid-state cesium, rubidium, etc. have relatively small surface tension (cesium: about 67 N/m, rubidium: about 80 N/m). In the case where the main body part 21 is formed using a glass material or the like, the wettability of the liquid-state alkali metal M with respect to the inner wall surface of the space S2 becomes relatively high. On the other hand, metal atoms having large surface tension are used or liquid-repellent treatment is performed on the inner wall surface of the space S2, and thereby, the wettability of the liquid-state alkali metal M with respect to the inner wall surface of the space S2 may be made relatively low.

Further, the volume of the liquid-state alkali metal M contained within the space S2 may change due to thermal expansion, thermal contraction, decrease of the liquid-state alkali metal M with decrease of the gaseous alkali metal, or the like. The space S2 is adapted to house the liquid-state alkali metal M even when the volume of the liquid-state alkali metal M changes. Therefore, the influence by the volume change of the liquid-state alkali metal M on the gaseous alkali metal within the space S1 may be suppressed.

In the embodiment, as shown in FIG. 6, as seen from the Z-axis direction, the space S2 forms a circular shape. Therefore, the width of the space S2 along the Y-axis direction is equal to the width of the space S2 along the X-axis direction. Note that the width of the space S2 along the Y-axis direction may be different from the width of the space S2 along the X-axis direction (e.g., see the seventh and eighth embodiments to be described later).

Further, as shown in FIG. 5, the space S3 that allows communication between the space S1 and the space S2 connects the ends of the space S1 and the space S2 at one window part 22 side. In other words, the space S3 allows the space S1 and the space S2 to communicate with each other and connects to one window part 22 of the pair of window parts 22, 23. That is, only the end at the one window part 22 side of the space S2 is open to the space S1 via the space S3. Thereby, the excessive alkali metal M may be housed in the end of the space S2 at the other window part 23. Accordingly, the gas cell 2 may be downsized while the desired volume of the space S2 is secured.

The width of the space S3 is not particularly limited, but may be the same as or different from the above described width of the space S2. Regarding the width along the Z-axis direction, the minimum width W2 of the space S3 is preferably equal to or more than the above described minimum width W1 of the space S2 and equal to or less than a half of the distance between the pair of window parts 22, 23, more preferably equal to or less than a one-third, and yet most preferably equal to or less than a one-fourth. Thereby, the influence of the space S3 on the gaseous alkali metal within the space S1 may be suppressed while the desired volume of the space S2 is secured.

Further, in the embodiment, the cross-section shape of the groove 213 is a rectangular shape, and the cross-section shape of the space S3 (the shape as seen from the X-axis direction) is a rectangular shape as shown in FIG. 4. Note that the groove 213 may be a U-shaped groove, a V-shaped groove, or the like, and the cross-section shape of the space S3 is not limited to the rectangular shape.

The respective window parts 22, 23 bonded to the main body part 21 have transmissivity with respect to excitation light from the above described light output part 3. Further, one window part 22 is a light incident-side window part that the excitation light LL enters into the space S1 of the gas cell 2 and the other window part 23 is a light exiting-side window part that the excitation light LL exits out of the space S2 of the gas cell 2.

Further, the window parts 22, 23 respectively have plate shapes and are provided so that the plate surfaces may be perpendicular to the axis of the excitation light LL.

A material forming the window parts 22, 23 of the gas cell 2 is not particularly limited as long as it has the above described transmissivity with respect to the excitation light. For example, a glass material, crystal, or the like may be employed. Note that the window parts 22, 23 may be formed using silicon depending on the thickness of the window parts 22, 23 and the intensity of the excitation light.

On the other hand, a material forming the main body part 21 of the gas cell 2 is not particularly limited, but may be a glass material, crystal, or the like, like the window parts 22, 23 or a metal material, a resin material, a silicon material, or the like may be employed. Of them, as the constituent material of the main body part 21, one of the glass material, the crystal, and the silicon material is preferably used, and the silicon material is more preferably used. Thereby, even when the small gas cell 2 having the width and height equal to or less than 10 mm is formed, the precise main body part 21 may be easily formed using the microfabrication technology including etching. Further, the main body part 21 formed using the silicon material may be easily and air-tightly bonded by anodic bonding to the window parts 22, 23 formed using the glass material.

Furthermore, the bonding method of the main body part 21 and the window parts 22, 23 of the gas cell 2 is determined according to the constituent materials and not particularly limited as long as it may perform air-tight bonding. For example, a bonding method using an adhesive agent, direct bonding, anodic bonding, or the like may be employed.

In addition, the gas cell 2 is temperature-adjusted by the heater 6 to about 70° C., for example.

Light Source

The light output part 3 (light source) has a function of outputting excitation light LL that excites alkali metal atoms in the gas cell 2.

More specifically, the light output part 3 outputs the above described two kinds of light (resonance light 1 and resonance light 2) having different frequencies as excitation lights LL.

The resonance light 1 may excite the alkali metal within the gas cell 2 from the above described ground state 1 to the excited state. On the other hand, the resonance light 2 may excite the alkali metal within the gas cell 2 from the above described ground state 2 to the excited state.

The light output part 3 is not particularly limited as long as it may output the above described excitation lights. For example, a semiconductor laser including a vertical cavity surface emitting laser (VCSEL) or the like may be used.

The light output part 3 is connected to an excitation light control part 12 of the control part 10, which will be described later, and drive-controlled based on the detection result of the light detection part 5 (see FIG. 1).

Further, the light output part 3 is temperature-adjusted to a predetermined temperature by a temperature control element (not shown) (heating resistor, Peltier element, or the like).

Optical Components

The plurality of optical components 41, 42, 43, 44 are respectively provided in the optical path of excitation light LL between the above described light output part 3 and gas cell 2.

Here, they are arranged in the order of the optical component 41, the optical component 42, the optical component 43, and the optical component 44 from the light output part 3 side toward the gas cell 2 side.

The optical component 41 is a lens. Thereby, the excitation light LL may be applied to the gas cell 2 without any waste.

Further, the optical component 41 has a function of parallelizing the excitation light LL. Thereby, the excitation light LL may be easily and reliably prevented from being reflected by the inner wall of the gas cell 2. Accordingly, resonance of the excitation light within the gas cell 2 may be preferably generated and, as a result, the oscillation characteristics of the atomic oscillator 1 may be improved.

The optical component 42 is a polarizer. Thereby, the polarization of the excitation light LL from the light output part 3 may be adjusted to a predetermined direction.

The optical component 43 is a neutral density filter (ND filter). Thereby, the intensity of the excitation light LL entering the gas cell 2 may be adjusted (reduced). Accordingly, even when the output of the light output part 3 is larger, an amount of the excitation light entering the gas cell 2 may be a desired amount. In the embodiment, the intensity of the excitation light LL passing through the above described optical component 42 and having polarization in the predetermined direction is adjusted by the optical component 43.

The optical component 44 is a $\lambda/4$ wave plate. Thereby, the excitation light LL from the light output part 3 may be converted from linearly-polarized light into circularly-polarized light (right circularly-polarized light or left circularly-polarized light).

Under a condition that the alkali metal atoms within the gas cell 2 are Zeeman-split by the magnetic field of the magnetic field generation part 8 as will be described later, if the linearly-polarized excitation light is applied to the alkali metal atoms, by the interaction between the excitation light and the alkali metal atoms, the alkali metal atoms are Zeeman-split and uniformly distributed at a plurality of levels. As a result, the number of alkali metal atoms at a desired energy level is relatively smaller than the numbers of alkali metal atoms at the other energy levels, and thus, the number of atoms that exhibit a desired EIT phenomenon decreases and the intensity of desired EIT signals decreases. As a result, the oscillation characteristics of the atomic oscillator 1 are degraded.

On the other hand, under a condition that the alkali metal atoms within the gas cell 2 are Zeeman-split by the magnetic field of the magnetic field generation part 8 as will be described later, if the circularly-polarized excitation light is applied to the alkali metal atoms, by the interaction between the excitation light and the alkali metal atoms, of a plurality of levels at which the alkali metal atoms are Zeeman-split, the number of alkali metal atoms at a desired energy level may be made relatively larger than the numbers of alkali metal atoms at the other energy levels. Accordingly, the number of atoms that exhibit a desired EIT phenomenon increases and the intensity of desired EIT signals increases. As a result, the oscillation characteristics of the atomic oscillator 1 may be improved.

Light Detection Part

The light detection part 5 has a function of detecting the intensity of the excitation lights LL (resonance lights 1, 2) transmitted in the gas cell 2.

The light detection part 5 is not particularly limited as long as it may detect the above described excitation lights. For example, a solar cell, a photodetector (light receiving element) including a photodiode may be employed.

The light detection part 5 is connected to the excitation light control part 12 of the control part 10 to be described later (see FIG. 1).

Heater

The heater 6 (heating part) has a function of heating the above described gas cell 2 (more specifically, the alkali metal in the gas cell 2). Thereby, the alkali metal in the gas cell 2 may be maintained in the gas state at the appropriate concentration.

The heater 6 generates heat by energization (direct-current), and includes, for example, two heating resistors (not shown) provided on the outer surface of the gas cell 2.

Here, one heating resistor is provided in the window part 22 (incident-side window part) of the gas cell 2 and the other heating resistor is provided in the window part 23 (exiting-side window part) of the gas cell 2. The heating resistors are respectively provided in the window parts 22, 23, and thereby, condensation of the alkali metal atoms in the window parts 22, 23 of the gas cell 2 may be prevented. As a result, the characteristics of the atomic oscillator 1 (oscillation characteristics) may be made advantageous for a long period of time.

Further, it is preferable that the heating resistor at the window 23 side is adapted so that the temperature of the part corresponding to the space S2 is lower than those of the other parts, for example, the part corresponding to the space S2 is lost or heat dissipation of the part corresponding to the space S2 is improved. Thereby, the alkali metal may be easily precipitated to the end of the space S2 at the side in the +Z-axis direction.

The heating resistor is formed using a material having transmissivity with respect to the excitation light, specifically, for example, a transparent electrode material of oxide including ITO (Indium Tin Oxide), IZO (Indium Zinc Oxide), $In_2O_3$, $SnO_2$, $SnO_2$ containing Sb, or ZnO containing Al.

Further, the heating resistor may be formed using, for example, chemical vapor deposition (CVD) including plasma CVD and thermal CVD, dry plating including vacuum deposition, a sol-gel process, or the like.

Note that the heater 6 is not limited to the above described form as long as it may heat the gas cell 2, but various kinds of heaters may be employed. Further, the heater 6 may be contactless with respect to the gas cell 2. Furthermore, the gas cell 2 may be heated using a Peltier element in place of the heater 6, or, in conjunction with the heater 6.

The heater 6 is electrically connected to a temperature control part 11 of the control part 10, which will be described later, and energized (see FIG. 1).

Temperature Sensor

The temperature sensor 7 detects the temperature of the heater 6 or the gas cell 2. Further, the amount of generated heat by the above described heater 6 is controlled based on the detection result of the temperature sensor 7. Thereby, the alkali metal atoms within the gas cell 2 may be maintained at a desired temperature.

Note that the position where the temperature sensor 7 is provided is not particularly limited. For example, the sensor may be provided on the heater 6 or on the outer surface of the gas cell 2.

The temperature sensor 7 is not particularly limited, but various kinds of known temperature sensors including a thermistor and a thermocouple may be employed.

The temperature sensor 7 is electrically connected to the temperature control part 11 of the control part 10, which will be described later, via wiring (not shown) (see FIG. 1).

Magnetic Field Generation Part

The magnetic field generation part 8 has a function of generating a magnetic field for Zeeman splitting of the plurality of degenerated energy level of the alkali metal within the gas cell 2. Thereby, by the Zeeman splitting, gaps between the different degenerated energy levels of the alkali metal may be expanded and resolution may be improved. As a result, the precision of the oscillation frequency of the atomic oscillator 1 may be improved.

The magnetic field generation part 8 includes a Helmholtz coil provided to sandwich the gas cell 2 or a solenoid coil provided to cover the gas cell 2. Thereby, a unidirectional homogeneous magnetic field may be generated within the gas cell 2.

Further, the magnetic field generated by the magnetic field generation part 8 is a constant magnetic field (direct-current magnetic field), however, an alternating-current magnetic field may be superimposed thereon.

The magnetic field generation part 8 is electrically connected to a magnetic field control part 13 of the control part 10, which will be described later, and energization-controlled (see FIG. 1).

Control Part

The control part 10 shown in FIG. 1 has a function of respectively controlling the light output part 3, the heater 6, and the magnetic field generation part 8.

The control part 10 has the excitation light control part 12 that controls the frequencies of the resonance lights 1, 2 of the light output part 3, the temperature control part 11 that controls the temperature of the alkali metal in the gas cell 2, and the magnetic field control part 13 that controls the magnetic field from the magnetic field generation part 8.

The excitation light control part 12 controls the frequencies of the resonance lights 1, 2 output from the light output part 3 based on the detection result of the above described light detection part 5. More specifically, the excitation light control part 12 controls the frequencies of the resonance lights 1, 2 output from the light output part 3 so that ($\omega_1 - \omega_2$) detected by the above described light detection part 5 may be the above described frequency $\omega_0$ unique to the alkali metal. Further, the excitation light control part 12 controls the center frequencies of the resonance lights 1, 2 output from the light output part 3.

Furthermore, the excitation light control part 12 includes a voltage-controlled crystal oscillator (oscillation circuit) (not shown), and synchronizes and adjusts the oscillation frequency of the voltage-controlled crystal oscillator based on the sensing result of the light detection part 5 and outputs as an output signal of the atomic oscillator 1.

Further, the temperature control part 11 controls energization to the heater 6 based on the detection result of the temperature sensor 7. Thereby, the gas cell 2 may be maintained within a desired temperature range.

Furthermore, the magnetic field control part 13 controls energization to the magnetic field generation part 8 so that the magnetic field generated by the magnetic field generation part 8 may be constant.

The control part 10 is provided on an IC chip mounted on a substrate, for example.

According to the above explained atomic oscillator 1, the wall part 214 intervenes between the space S1 and the space S2 of the gas cell 2, and thereby, the gaseous alkali metal within the space S1 may be suppressed from coming into contact with the liquid-state or solid-state alkali metal M. As a result, the condition of the gaseous alkali metal within the space S1 may be prevented or suppressed from being inhomogeneous and characteristic degradation due to the excessive alkali metal M may be suppressed.

Second Embodiment

Next, the second embodiment of the invention will be explained.

Figure 7:
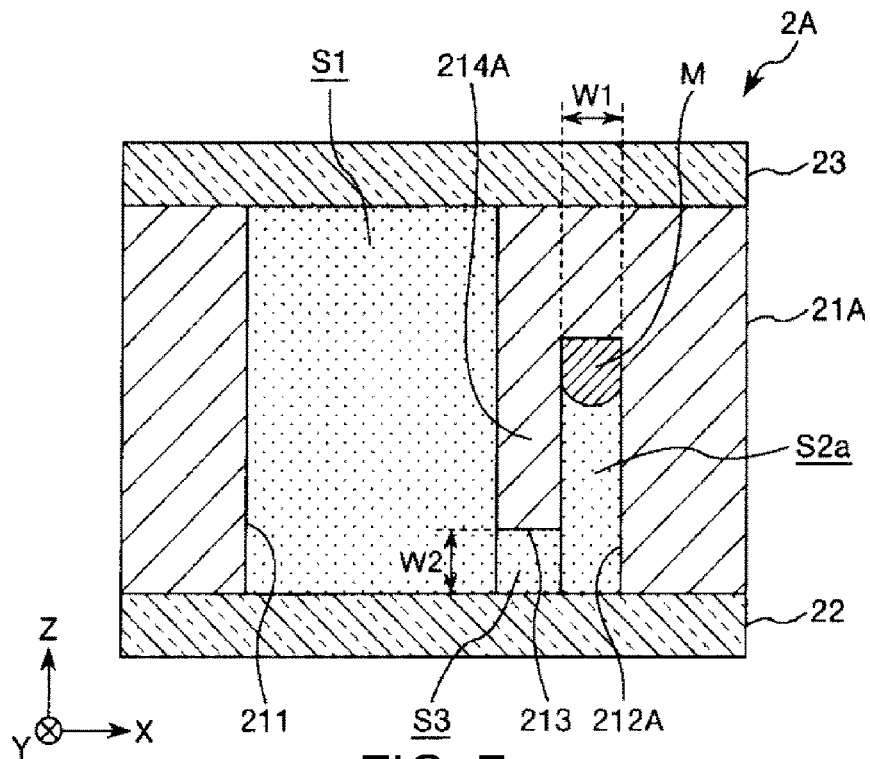
FIG. 7 is a longitudinal sectional view showing a gas cell according to a second embodiment of the invention.

FIG. 7 is a longitudinal sectional view showing a gas cell according to the second embodiment of the invention.

The embodiment is the same as the above described first embodiment except the difference in the configuration of the metal reservoir part of the atom cell.

Note that, in the following explanation, the second embodiment will be explained with a focus on the difference from the above described embodiment, and the explanation of the same items will be omitted. Further, in FIG. 7, the same configurations as those of the above described embodiment have the same signs.

A gas cell 2A of the embodiment includes a main body part 21A in place of the main body part 21 of the first embodiment.

In the main body part 21A, a recessed part 212A opening to the side in the −Z-axis direction is formed. By the recessed part 212A, a space S2 a as a metal reservoir part communicating with the space S1 via the space S3 is formed. A wall part 214A intervenes between the space S2 a and the space S1.

Further, the space S2 a has a length along the Z-axis direction that is shorter than that of the space S1. Accordingly, the end of the space S2 a at the window part 23 side is spaced apart from the window part 23. Therefore, in the case where the heater 6 includes the two heating resistors provided on the window parts 22, 23, the temperature of the end of the space S2 a at the window part 23 side may be made lower. Thereby, the alkali metal M may be easily precipitated to the end of the space S2 at the side in the +Z-axis direction.

According to the above explained second embodiment, the characteristic degradation due to the excessive alkali metal M may be suppressed.

Third Embodiment

Next, the third embodiment of the invention will be explained.

Figure 8:
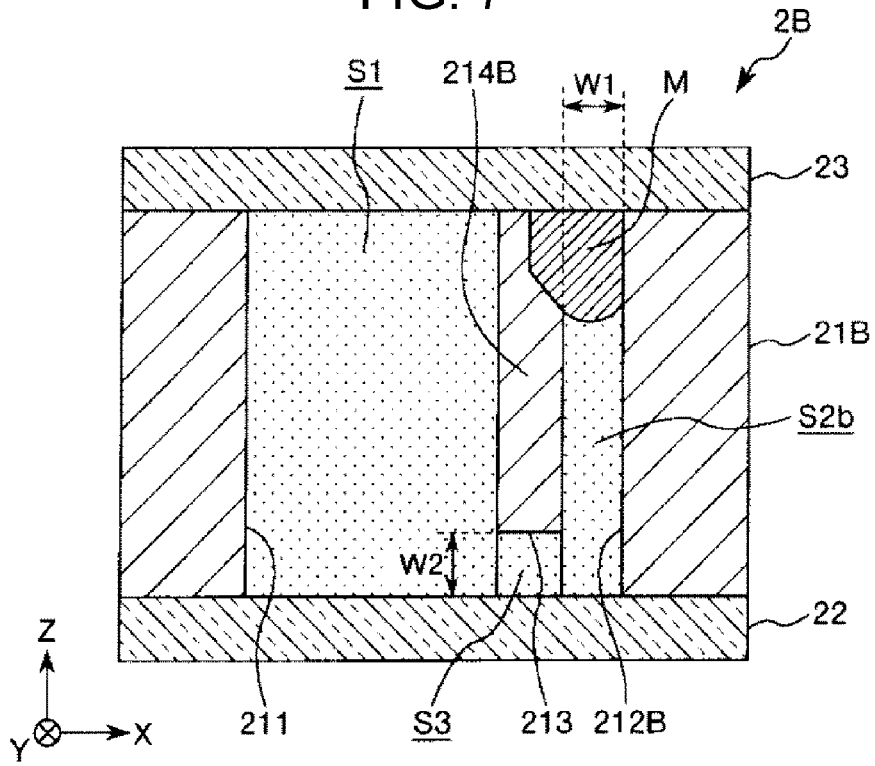
FIG. 8 is a longitudinal sectional view showing a gas cell according to a third embodiment of the invention.

FIG. 8 is a longitudinal sectional view showing a gas cell according to the third embodiment of the invention.

The embodiment is the same as the above described first embodiment except the difference in the configuration of the metal reservoir part of the atom cell.

Note that, in the following explanation, the third embodiment will be explained with a focus on the difference from the above described embodiments, and the explanation of the same items will be omitted. Further, in FIG. 8, the same configurations as those of the above described embodiments have the same signs.

A gas cell 2B of the embodiment includes a main body part 21B in place of the main body part 21 of the first embodiment.

In the main body part 21B, a through hole 212B is formed. By the through hole 212B, a space S2 b as a metal reservoir part communicating with the space S1 via the space S3 is formed. A wall part 214B intervenes between the space S2 b and the space S1.

Further, the space S2 b has a part having a width that is wider toward the window part 23 side. Thereby, the liquid-state alkali metal M may be kept in the end of the space S2 b at the window part 23 side by the same action as that of a liquid-column thermometer. Accordingly, the liquid-state alkali metal M may be kept in the space S2 b more easily while the desired volume of the space S2 b is secured.

According to the above explained third embodiment, the characteristic degradation due to the excessive alkali metal M may be suppressed.

Fourth Embodiment

Next, the fourth embodiment of the invention will be explained.

Figure 9:
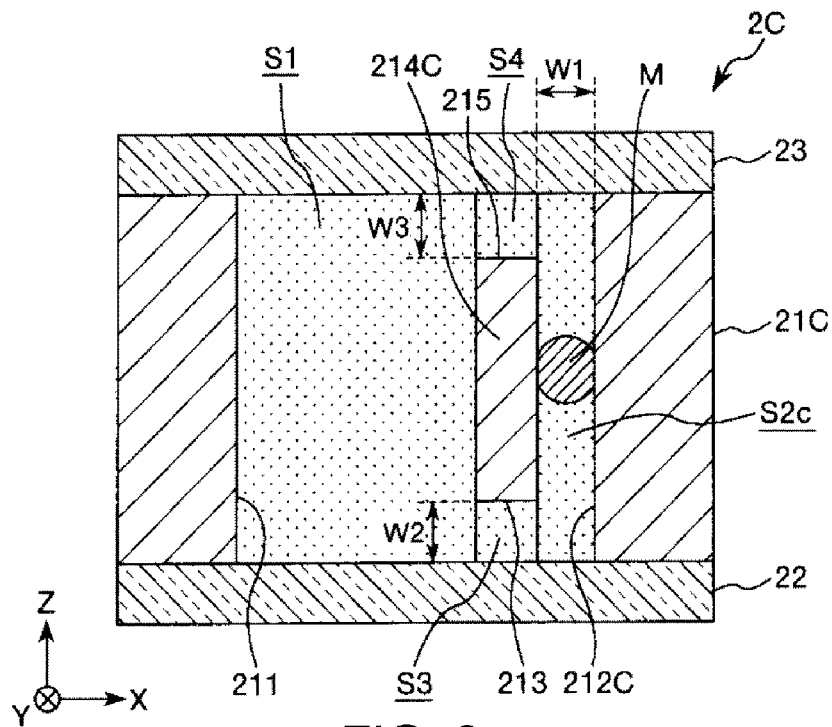
FIG. 9 is a longitudinal sectional view showing a gas cell according to a fourth embodiment of the invention.

FIG. 9 is a longitudinal sectional view showing a gas cell according to the fourth embodiment of the invention.

The embodiment is the same as the above described first embodiment except the difference in the configuration of the metal reservoir part and the communication part of the atom cell.

Note that, in the following explanation, the fourth embodiment will be explained with a focus on the difference from the above described embodiments, and the explanation of the same items will be omitted. Further, in FIG. 9, the same configurations as those of the above described embodiments have the same signs.

A gas cell 2C of the embodiment includes a main body part 21C in place of the main body part 21 of the first embodiment.

In the main body part 21C, a through hole 212C and a groove 215 open to the side in the +Z-axis direction are formed. By the through hole 212C, a space S2 c as a metal reservoir part is formed and the space S2 c communicates with the space S1 via the space S3 (first communication part) by the groove 213 and a space S4 (second communication part) by the groove 215. A wall part 214C intervenes between the space S2 c and the space S1.

Here, the space S3 connects the space S1 and the end of the space S2 c at one window part 22 side and the space S4 connects the space S1 and the end of the space S2 c at the other window part 23 side. Thereby, the space S2 c communicates with the space S1 via the two spaces S3, S4, and, even if the liquid-state alkali metal is precipitated in the space S1, the liquid-state alkali metal may be easily moved to the space S2c via the space S3 or the space S4.

Note that a width W3 of the space S4 is not particularly limited, but may be the same as a width W4 of the space S3.

According to the above explained fourth embodiment, the characteristic degradation due to the excessive alkali metal M may be suppressed.

Fifth Embodiment

Next, the fifth embodiment of the invention will be explained.

Figure 10:
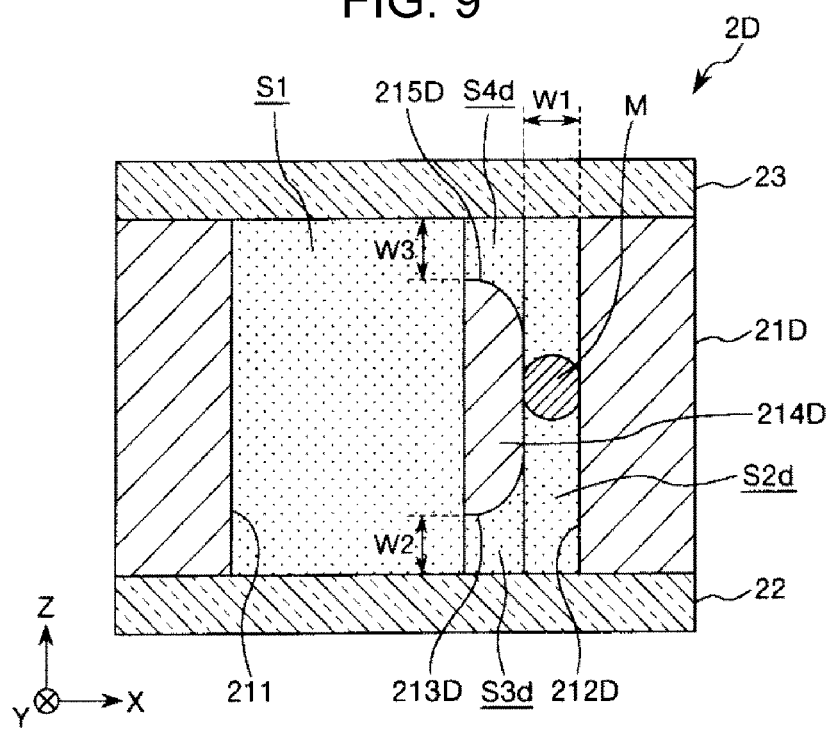
FIG. 10 is a longitudinal sectional view showing a gas cell according to a fifth embodiment of the invention.

FIG. 10 is a longitudinal sectional view showing a gas cell according to the fifth embodiment of the invention.

The embodiment is the same as the above described first embodiment except the difference in the configuration of the metal reservoir part and the communication part of the atom cell.

Note that, in the following explanation, the fifth embodiment will be explained with a focus on the difference from the above described embodiments, and the explanation of the same items will be omitted. Further, in FIG. 10, the same configurations as those of the above described embodiments have the same signs.

A gas cell 2D of the embodiment includes a main body part 21D in place of the main body part 21 of the first embodiment.

In the main body part 21D, a through hole 212D, a groove 213D open to the side in the −Z-axis direction, and a groove 215D open to the side in the +Z-axis direction are formed. By the through hole 212D and the grooves 213D, 215D, a space S2 d as a metal reservoir part and spaces S3d, S4 d that allow the space S2 d and the space S1 to communicate with each other are formed. A wall part 214D intervenes between the space S2 d and the space S1.

Here, the space S3 d connects the space S1 and the end of the space S2 d at one window part 22 side and the space S4 d connects the space S1 and the end of the space S2 d at the other window part 23 side.

In addition, the space S2 d has a part having a narrower width (width along the X-axis) in the middle (in the middle in the Z-axis direction). Thereby, when the wettability of the liquid-state alkali metal M with respect to the inner wall surface of the space S2 d is relatively low, the liquid-state alkali metal M may be made to stay in the narrower part of the space S2 d by the capillary phenomenon.

According to the above explained fifth embodiment, the characteristic degradation due to the excessive alkali metal M may be suppressed.

Sixth Embodiment

Next, the sixth embodiment of the invention will be explained.

Figure 11:
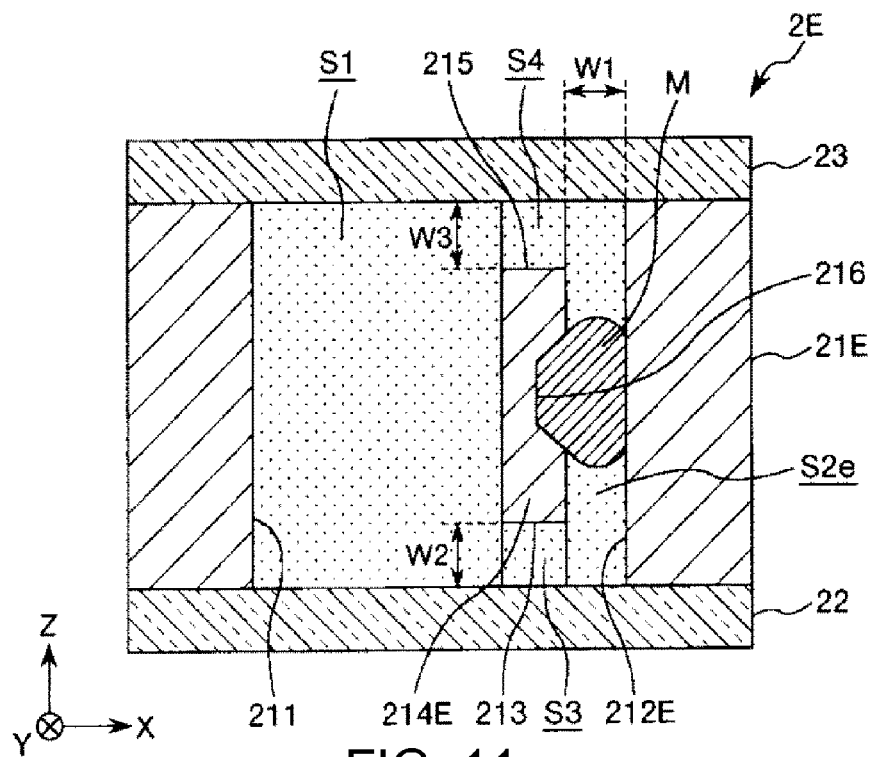
FIG. 11 is a longitudinal sectional view showing a gas cell according to a sixth embodiment of the invention.

FIG. 11 is a longitudinal sectional view showing a gas cell according to the sixth embodiment of the invention.

The embodiment is the same as the above described first embodiment except the difference in the configuration of the metal reservoir part and the communication part of the atom cell.

Note that, in the following explanation, the sixth embodiment will be explained with a focus on the difference from the above described embodiments, and the explanation of the same items will be omitted. Further, in FIG. 11, the same configurations as those of the above described embodiments have the same signs.

A gas cell 2E of the embodiment includes a main body part 21E in place of the main body part 21 of the first embodiment.

In the main body part 21E, a through hole 212E is formed. By the through hole 212E, a space S2 e as a metal reservoir part is formed. A wall part 214E intervenes between the space S2 e and the space S1.

Here, the space S3 connects the space S1 and the end of the space S2 e at one window part 22 side and the space S4 connects the space S1 and the end of the space S2 e at the other window part 23 side.

In addition, the space S2 e has a part 216 having a width that is wider in the middle. Thereby, in the case where the wettability of the liquid-state alkali metal M with respect to the inner wall surface of the space S2 e is relatively high, the liquid-state alkali metal M may be made to stay in the wider part 216 of the space S2 e by the surface tension.

According to the above explained sixth embodiment, the characteristic degradation due to the excessive alkali metal M may be suppressed.

Seventh Embodiment

Next, the seventh embodiment of the invention will be explained.

Figure 12:
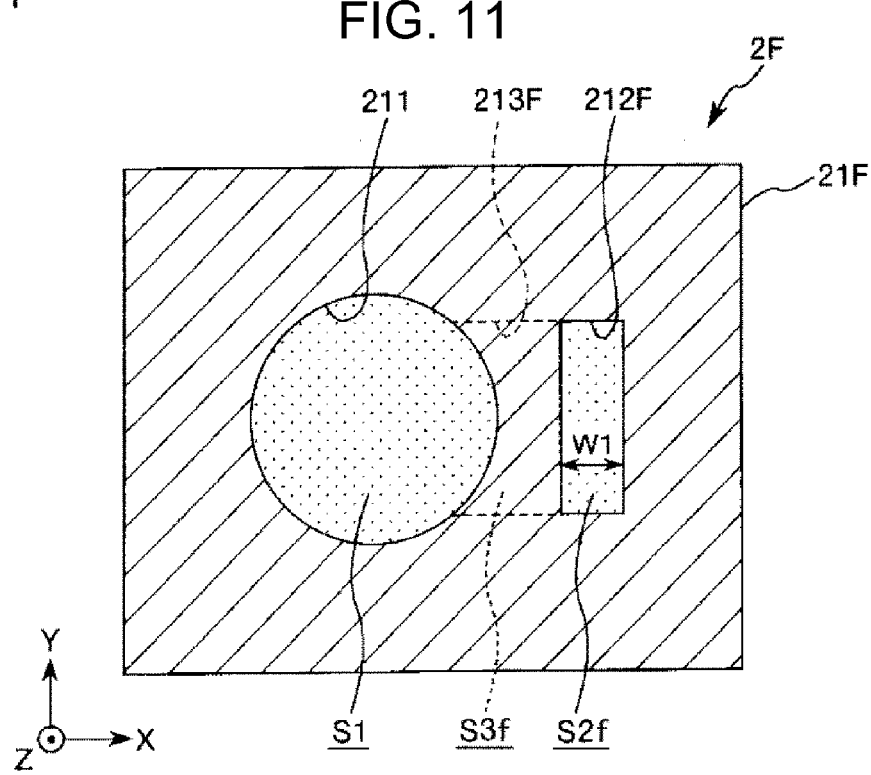
FIG. 12 is a cross-sectional view showing a gas cell according to a seventh embodiment of the invention.

FIG. 12 is a cross-sectional view showing a gas cell according to the seventh embodiment of the invention.

The embodiment is the same as the above described first embodiment except the difference in the configuration of the metal reservoir part and the communication part of the atom cell.

Note that, in the following explanation, the seventh embodiment will be explained with a focus on the difference from the above described embodiments, and the explanation of the same items will be omitted. Further, in FIG. 12, the same configurations as those of the above described embodiments have the same signs.

A gas cell 2F of the embodiment includes a main body part 21F in place of the main body part 21 of the first embodiment.

In the main body part 21F, a through hole 212F and a groove 213F open to the side in the −Z-axis direction are formed. By the through hole 212F and the groove 213F, a space S2 f as a metal reservoir part and a space S3 f that allows the space S2 f and the space S1 to communicate with each other are formed.

The space S2 f has a width along the Y-axis direction that is larger than a width along the X-axis direction. Thereby, the gas cell may be downsized while the desired volume of the space S f is secured.

Further, the width of the space S2 f along the X-axis direction is constant.

Furthermore, in the embodiment, the width of the space S3 f in the Y-axis direction is equal to the width of the space S2 f in the Y-axis direction, however, the width of the space S3 f in the Y-axis direction may be narrower than the width of the space S2 f in the Y-axis direction.

Note that the number of communication parts that allows the space S2 f and the space S1 to communicate with each other may be one as in the first embodiment or two as in the fourth embodiment.

According to the above explained seventh embodiment, the characteristic degradation due to the excessive alkali metal M may be suppressed.

Eighth Embodiment

Next, the eighth embodiment of the invention will be explained.

Figure 13:
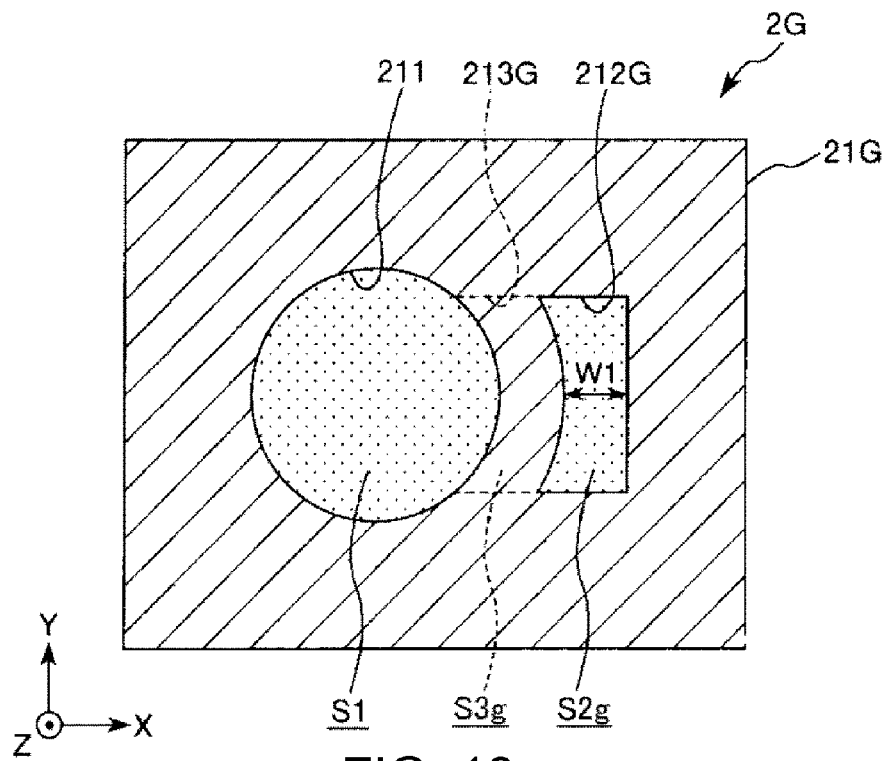
FIG. 13 is a cross-sectional view showing a gas cell according to an eighth embodiment of the invention.

FIG. 13 is a cross-sectional view showing a gas cell according to the eighth embodiment of the invention.

The embodiment is the same as the above described first embodiment except the difference in the configuration of the metal reservoir part and the communication part of the atom cell.

Note that, in the following explanation, the eighth embodiment will be explained with a focus on the difference from the above described embodiments, and the explanation of the same items will be omitted. Further, in FIG. 13, the same configurations as those of the above described embodiments have the same signs.

A gas cell 2G of the embodiment includes a main body part 21G in place of the main body part 21 of the first embodiment.

In the main body part 21G, a through hole 212G and a groove 213G open to the side in the −Z-axis direction are formed. By the through hole 212G and the groove 213G, a space S2 g as a metal reservoir part and a space S3 g that allows the space S2 g and the space S1 to communicate with each other are formed.

The space S2 g has a width along the Y-axis direction that is larger than a width along the X-axis direction.

In addition, in the embodiment, the space S2 g has a part having a narrower width along the X-axis direction at the center part side in the Y-axis direction. Thereby, when the wettability of the liquid-state alkali metal M with respect to the inner wall surface of the space S2 g is relatively low, the liquid-state alkali metal M may be made to stay in the narrower part of the space S2 g by the capillary phenomenon.

According to the above explained eighth embodiment, the characteristic degradation due to the excessive alkali metal M may be suppressed.

Ninth Embodiment

Next, the ninth embodiment of the invention will be explained.

Figure 14:
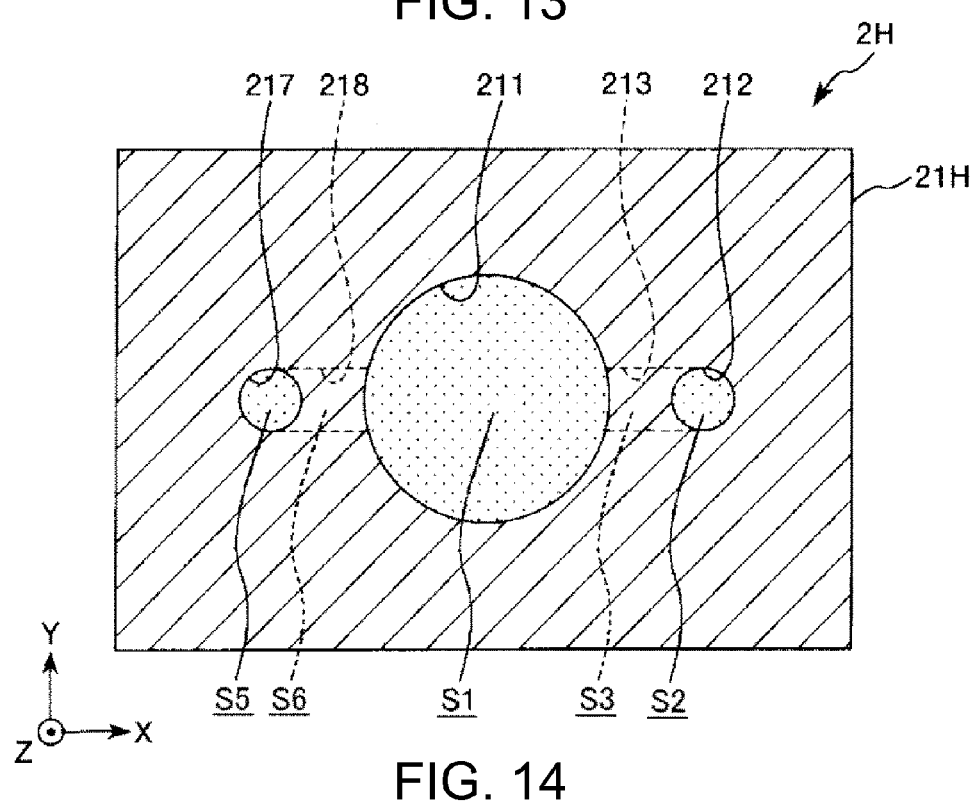
FIG. 14 is a cross-sectional view showing a gas cell according to a ninth embodiment of the invention.

FIG. 14 is a cross-sectional view showing a gas cell according to the ninth embodiment of the invention.

The embodiment is the same as the above described first embodiment except the difference in the configuration of the metal reservoir part of the atom cell.

Note that, in the following explanation, the ninth embodiment will be explained with a focus on the difference from the above described embodiments, and the explanation of the same items will be omitted. Further, in FIG. 14, the same configurations as those of the above described embodiments have the same signs.

A gas cell 2H of the embodiment includes a main body part 21H in place of the main body part 21 of the first embodiment.

In the main body part 21H, a through hole 217 and a groove 218 are formed. By the through hole 217 and the groove 218, a space S5 as a metal reservoir part and a space S6 that allows the space S1 and the space S5 to communicate with each other are formed. That is, the gas cell 2H has the spaces S2, S5 as the two metal reservoir parts and the spaces S3, S6 as two communication parts that allow the spaces S2, S5 and the space S1 to communicate with each other.

According to the above explained ninth embodiment, the characteristic degradation due to the excessive alkali metal M may be suppressed.

2. Electronic Apparatus

The above described atomic oscillators may be incorporated into various kinds of electronic apparatuses. The electronic apparatuses have advantageous reliability.

Below, an electronic apparatus according to an embodiment of the invention will be explained.

Figure 15:
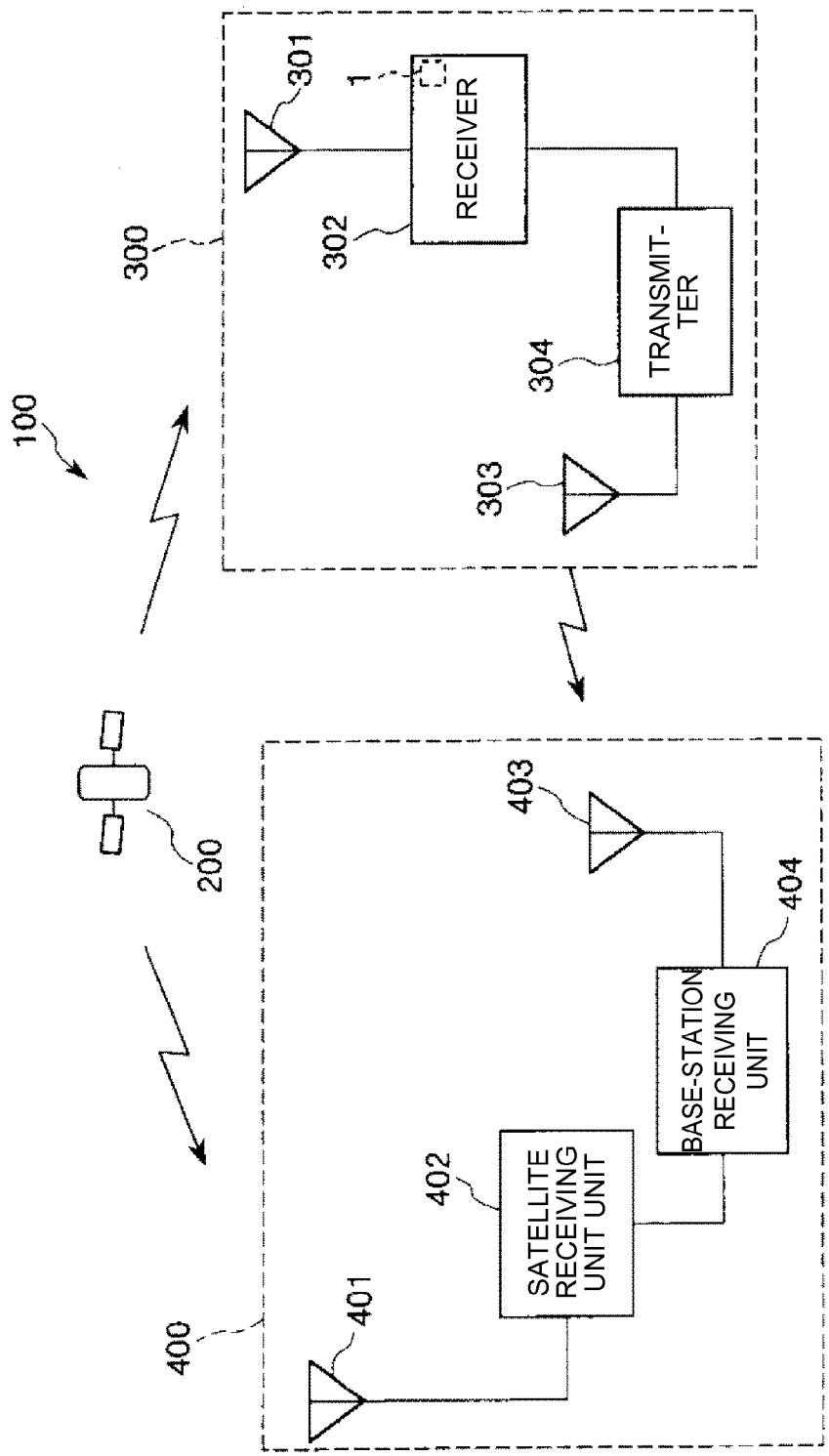
FIG. 15 shows a schematic configuration when the atomic oscillator according to the embodiments the invention is used for a positioning system using a GPS satellite.

FIG. 15 shows a schematic configuration when the atomic oscillator is used for a positioning system using a GPS satellite.

A positioning system 100 shown in FIG. 15 includes a GPS satellite 200, a base station apparatus 300, and a GPS receiving apparatus 400.

The GPS satellite 200 transmits positioning information (GPS signals).

The base station apparatus 300 includes a receiver 302 that precisely receives the positioning information from the GPS satellite 200 via an antenna 301 installed in an electronic reference point (GPS continuous observation station), and a transmitter 304 that transmits the positioning information received by the receiver 302 via an antenna 303.

Here, the receiver 302 is an electronic device including the above described atomic oscillator according to the embodiments of the invention as a reference frequency oscillation source thereof. The receiver 302 has advantageous reliability. Further, the positioning information received by the receiver 302 is transmitted by the transmitter 304 in real time.

The GPS receiving apparatus 400 includes a satellite receiver unit 402 that receives the positioning information from the GPS satellite 200 via an antenna 401 and a base-station receiving unit 404 that receives the positioning information from the base station apparatus 300 via an antenna 403.

3. Moving Object

Figure 16:
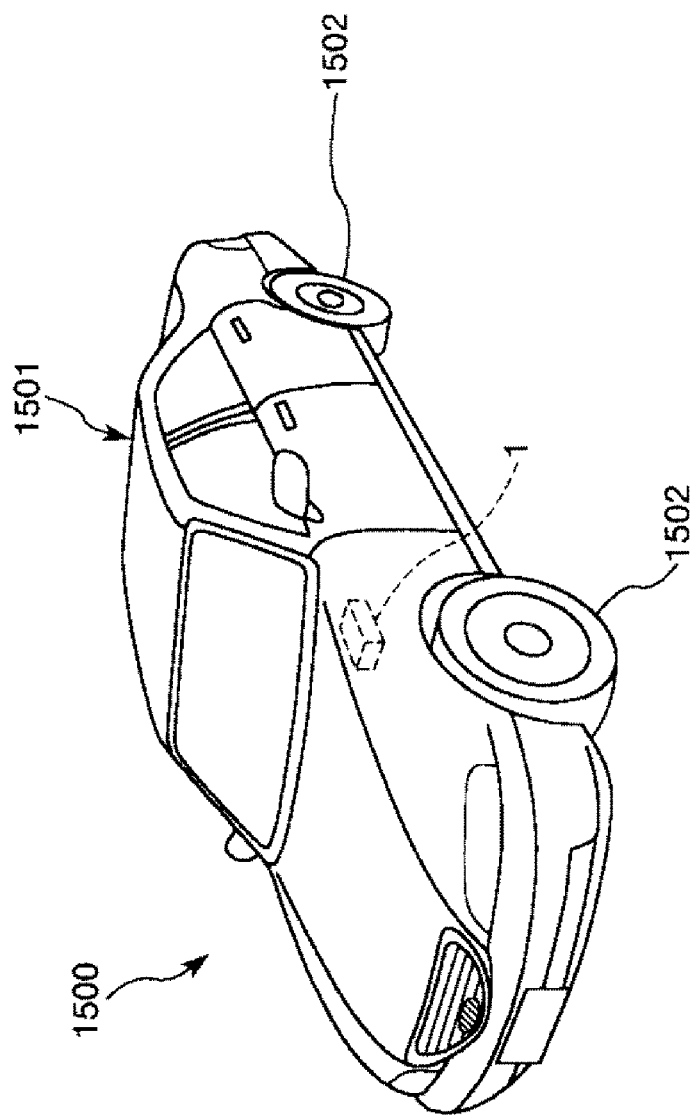
FIG. 16 shows an example of a moving object according to an embodiment of the invention.

FIG. 16 shows an example of a moving object according to an embodiment of the invention.

In the drawing, an automobile (moving object) 1500 includes a vehicle body 1501 and a four wheels 1502, and is adapted to turn the wheels 1502 by a power source (engine) (not shown) provided in the vehicle body 1501. The automobile 1500 contains the atomic oscillator 1.

According to the moving object, advantageous reliability may be exhibited.

Note that the electronic apparatus including the atomic oscillator according to the invention is not limited to the above described apparatus, but a cell phone, a digital still camera, an inkjet ejection device (for example, an inkjet printer), a personal computer (mobile personal computer, laptop personal computer), a television, a video camera, a video tape recorder, a car navigation system, a pager, a personal digital assistance (with or without communication function), an electronic dictionary, a calculator, an electronic game machine, a word processor, a work station, a videophone, a security television monitor, electronic binoculars, a POS terminal, a medical device (for example, an electronic thermometer, a sphygmomanometer, a blood glucose meter, an electrocardiographic measurement system, an ultrasonic diagnostic system, or an electronic endoscope), a fish finder, various measurement instruments, meters and gauges (for example, meters for vehicles, airplanes, and ships), a flight simulator, or the like.

The atom cell, the quantum interference device, the atomic oscillator, the electronic apparatus, and the moving object have been explained based on the illustrated embodiments, however, the invention is not limited to those.

Further, the configurations of the respective parts according to the invention may be replaced by arbitrary configurations that exhibit the same functions as those of the above described embodiments, or arbitrary configurations may be added.

Furthermore, in the invention, arbitrary configurations of the above described respective embodiments may be combined.

Further, in the above described embodiments, the example in which both the gas housing part and the metal reservoir part are formed in the main body part of the gas cell (atom cell) has been explained, however, the part forming the metal reservoir part may be separated from the part forming the gas housing part (the pair of window parts and the main body part). For example, a structure in which an internal space as the gas housing part is formed by bonding of the pair of window parts on both ends of a cylindrical member and a cylindrical member having a bottom in which an internal space is formed as the metal reservoir part are bonded so that the internal spaces may communicate with each other, and thereby, the gas cell having the gas housing part and the metal reservoir part may be formed.

Furthermore, in the above described embodiments, the example in which the communication part is connected to the end of the metal reservoir part in the longitudinal direction has been explained, however, the communication part may be connected to the center part of the metal reservoir part in the longitudinal direction. Note that the amount of liquid-state metal atoms that may be placed per one location may be made larger in the case where the communication part is connected to the end of the metal reservoir part in the longitudinal direction than in the case where the communication part may be connected to the center part of the metal reservoir part in the longitudinal direction.

The entire disclosure of Japanese Patent Application No. 2013-183735 filed Sep. 5, 2013 is hereby expressly incorporated by reference herein.

What is claimed is:

1. An atom cell comprising:
    a gas housing containing metal atoms in a gas state;
    a first window unit closing a first end of the gas housing;
    a second window unit closing a second end of the gas housing, the first and second ends being on opposite ends of the gas housing;
    a wall extending between the first and second window units; and
    a reservoir housing metal atoms in a liquid or solid state, the reservoir communicating with the gas housing,
    wherein the wall intervenes between the reservoir and the gas housing; and
    the reservoir includes a first portion and a second portion, the first portion having a first width and the second portion having a second width that is greater than the first width for retaining the metal atoms within the second portion.

2. The atom cell according to claim 1, wherein the reservoir extends along a surface of the wall.

3. The atom cell according to claim 1, wherein the reservoir has a part extending in the same direction as the first and second window units.

4. The atom cell according to claim 1, wherein the reservoir has a constricted section.

5. The atom cell according to claim 1, wherein the reservoir has an expanded section.

6. The atom cell according to claim 1, wherein the reservoir has a part having a width from 0.1 mm to 2 mm.

7. The atom cell according to claim 1, further comprising an interconnect communicably connecting the gas housing and the reservoir, the interconnect being adjacent to one of the first and second window units.

8. The atom cell according to claim 7, wherein the reservoir enlarges toward one of the first and second window units.

9. The atom cell according to claim 1, further comprising:
a first interconnect communicably interconnecting the gas housing and a first end of the reservoir proximate the first window unit; and
a second interconnect communicably interconnecting the gas housing and a second end of the reservoir proximate the second window unit.

10. The atom cell according to claim 1, wherein the reservoir extends between the first and second window units.

11. A quantum interference device comprising the atom cell according to claim 1.

12. An atomic oscillator comprising the atom cell according to claim 1.

13. An electronic apparatus comprising the atom cell according to claim 1.

14. A moving object comprising the atom cell according to claim 1.

15. The atom cell according to claim 1, wherein the reservoir communicates with the gas housing through a plurality of grooves in the wall, a first of the plurality of grooves being adjacent to the first window unit and a second of the plurality of grooves being adjacent to the second window unit, the wall separating the first of the plurality of grooves from the second of the plurality of grooves.

16. An atom cell comprising:
a body having:
a first columnar through hole containing metal atoms in a gas state;
a second columnar through hole containing metal atoms in a liquid or solid state, wherein the second columnar through hole includes a first portion and a second portion, the first portion having a first width and the second portion having a second width that is greater than the first width for retaining the metal atoms within the second portion; and
an interconnect communicably connecting the first and second columnar through holes;
a first transparent cover connected to a first surface of the body and closing a first end of the first columnar through hole and a first end of the second columnar through hole; and
a second transparent cover connected to a second surface of the body and closing a second end of the first columnar through hole and a second end of the second columnar through hole, the first and second surfaces being on opposite sides of the body, and the first and second ends being on opposite ends of the first columnar through hole.

17. The atom cell according to claim 16, wherein the interconnect extends along, and is enclosed by, one of the first and second transparent covers.

18. The atom cell according to claim 16, wherein the second columnar through hole has a constricted section.

19. The atom cell according to claim 16, wherein the second columnar through hole has an expanded section.

20. The atom cell according to claim 16, further comprising:
a second interconnect communicably interconnecting the first and second columnar through holes.

21. The atom cell according to claim 20, wherein the second interconnect extends along, and is enclosed by, one of the first and second transparent covers.

22. An atom cell comprising:
a body having:
a first columnar through hole containing metal atoms in a gas state;
a second columnar through hole containing metal atoms in a liquid state, wherein the second columnar through hole has a part having a width from 0.1 mm to 2 mm, wherein when the body is oriented on an end of the second columnar through hole, the metal atoms in the liquid state remain attached to a wall in the part by a capillary phenomenon; and
an interconnect communicably connecting the first and second columnar through holes;
a first transparent cover connected to a first surface of the body and closing a first end of the first columnar through hole and a first end of the second columnar through hole; and
a second transparent cover connected to a second surface of the body and closing a second end of the first columnar through hole and a second end of the second columnar through hole, the first and second surfaces being on opposite sides of the body, and the first and second ends being on opposite ends of the first columnar through hole.

23. An atom cell comprising:
a body having:
a first columnar through hole containing metal atoms in a gas state;
a second columnar through hole containing metal atoms in a liquid state, wherein the second columnar through hole has a part having a width from 0.1 mm to 2 mm, wherein the width is smaller than a length of the second columnar through hole; and
an interconnect communicably connecting the first and second columnar through holes;
a first transparent cover connected to a first surface of the body and closing a first end of the first columnar through hole and a first end of the second columnar through hole; and
a second transparent cover connected to a second surface of the body and closing a second end of the first columnar through hole and a second end of the second columnar through hole, the first and second surfaces being on opposite sides of the body, and the first and second ends being on opposite ends of the first columnar through hole,
wherein when the body is oriented on the second transparent cover, the metal atoms in the liquid state remain attached to a wall of the part of the second columnar through hole and the first transparent cover by a capillary phenomenon.

* * * * *